United States Patent
Hsu et al.

(10) Patent No.: US 7,292,494 B2
(45) Date of Patent: Nov. 6, 2007

(54) INTERNAL POWER MANAGEMENT SCHEME FOR A MEMORY CHIP IN DEEP POWER DOWN MODE

(75) Inventors: Jen-Shou Hsu, Hsinchu (TW); Tah-Kang Joseph Ting, Hsinchu (TW); Ming-Hung Wang, Hsinchu (TW); Bor-Doou Rong, Hsinchu (TW)

(73) Assignee: Etron Technology Inc., Hsinchu (TW)

( * ) Notice: Subject to any disclaimer, the term of this patent is extended or adjusted under 35 U.S.C. 154(b) by 38 days.

(21) Appl. No.: 11/339,624

(22) Filed: Jan. 26, 2006

(65) Prior Publication Data
US 2006/0146636 A1    Jul. 6, 2006

Related U.S. Application Data

(63) Continuation of application No. 10/861,157, filed on Jun. 4, 2004, now Pat. No. 7,031,219.

(51) Int. Cl.
*G11C 16/06* (2006.01)
(52) U.S. Cl. ........................ 365/226; 365/227
(58) Field of Classification Search ............. 365/226, 365/227
See application file for complete search history.

(56) References Cited

U.S. PATENT DOCUMENTS

| 5,197,034 | A  |   | 3/1993 | Fandrich et al. |
|-----------|----|---|--------|-----------------|
| 6,243,315 | B1 |   | 6/2001 | Goodman |
| 6,510,096 | B2 | * | 1/2003 | Choi et al. ............ 365/226 |
| 6,744,687 | B2 | * | 6/2004 | Koo et al. ............ 365/226 |
| 6,850,453 | B2 | * | 2/2005 | Park ..................... 365/227 |
| 2004/0001386 | A1 |   | 1/2004 | Park |
| 2004/0004513 | A1 |   | 1/2004 | Rhee et al. |

* cited by examiner

*Primary Examiner*—Son Dinh
*Assistant Examiner*—N Nguyen
(74) *Attorney, Agent, or Firm*—Rosenberg, Klein & Lee

(57) ABSTRACT

A method for a deep power down mode is described for a memory chip in which voltage regulators and charge pumps are turned off, memory cell voltages are floated, and support circuit internal power supply voltages are replaced by voltages that are derived from the external chip voltage. Prior to being placed into a deep power down mode, all memory cells are placed into a precharge state from which the memory cell voltages are floated upon entering the deep power down mode. Pass through circuits connect externally derived voltages to the support circuit power supply voltage lines, controlled by a deep power down signal. Maintaining a voltage bias on the support circuits prevents latch up problems when the memory chip is brought out of the deep power down mode.

13 Claims, 7 Drawing Sheets

INTERNAL POWER MANAGEMENT SCHEME FOR A MEMORY CHIP IN DEEP POWER DOWN MODE

This application is a continuation of application Ser. No. 10/861,157, filed Jun. 4, 2004.

BACKGROUND OF THE INVENTION

1. Field of Invention

The present invention refers to memory chips and in particular to memory chips in a deep power down mode.

2. Description of Related Art

There is an ever-increasing application for low power computing devices, including memory. As performance and size of memory devices increase, the power dissipated by these devices increases. This places an additional burden on the batteries required to power the memory and other computing devices. With the increase power and performance and the resulting need for more energy has come a new requirement for a deep power down mode. When in a deep power down mode, a chip can only be allowed to consume a very low amount of standby power, which requires chip current to be less than approximately 10 ua. This low current target is not easy to achieve and requires an internal power management scheme.

In U.S. Pat. No. 6,243,315 B1 (Goodman) a memory system is directed to a control scheme in which a low power mode is invoked when the memory is not being used, wherein a control device isolates the memory devices and places them in a self-refresh mode. In U.S. Pat. No. 5,197,034 (Fandrich et al.) is directed to a non-volatile memory with control circuitry, which when placed in a third control state, switches the memory into a substantially powered down state.

A method is needed to provide a deep power down of memory devices when not in use, such as a DRAM. The memory devices then need to be brought back to normal power when they are needed to perform an operation. Integrity of the stored data needs not to be maintained during the deep power down operation, the stay in the deep power down mode and the re-establishment of normal power.

SUMMARY OF THE INVENTION

It is an objective of the present invention to provide a voltage management scheme for the internal power of a memory device to save power.

It is also an objective of the present invention to provide a deep power down mode for a memory device.

It is further an objective of the present invention to maintain the voltages of circuits not related to a precharged memory cell by turning on a pass gate circuit, which connects an external chip voltage to the internal circuits in place of voltage regulators and charge pump circuits.

It is still further an objective of the present invention to float circuits, which are related to a precharged memory cell by turning off regulators and charge pump circuits.

It is another objective of the present invention to reduce to a very low current amount when a memory chip is placed into a deep power down mode.

It is still another objective of the present invention to maintain power to memory support circuits during deep power down by replacing voltage regulator and pump circuits voltages with an external chip voltage through a pass gate circuit.

It is also another objective of the present invention to clamp to ground the output of charge pump circuits and voltage regulators during deep power down mode.

It is also still another objective of the present invention to float output of all charge pumps and voltage regulators.

It is still further an objective of the present invention to float the memory cells by turning off regulators and charge pumps during deep power down mode.

In the present invention a method is described by which chip power and thereby chip current is reduced while in deep power down mode. The deep power down mode is used on low power semiconductor memory devices, such as a DRAM and pseudo SRAM, to conserve power on battery operated equipment such as laptop computers.

The deep power down mode is a unique function on some special memory RAM devices, such as mobile RAM and pseudo SRAM with very low standby power. A deep power down mode is different from a power down mode. In a deep power down mode all memory data can be lost. During both the power down mode and the deep power down mode refresh is not permitted. In a power down mode all memory data must be preserved; therefore, the memory chip cannot be permitted to be in the power down mode longer than a refresh cycle. In the deep power down mode there is no time limit, and data will be lost if the chip stays in the deep power down mode longer than a refresh cycle Before entering the deep power down mode all memory cells are first placed into a precharge state. After entering the power down mode, all voltage regulators and pump circuits are turned off and the external chip voltage VDD becomes the power source for internal peripheral support circuits not related to the voltage of the precharged memory cells, where VCC, an internal support circuit power supply voltage, is replaced with VDD or VCC=VDD−Vt, or VCC=VDD−nVt, where Vt is the threshold voltage for a MOS transistor and n is the number of MOS bias devices used to reduce the VCC voltage. During the deep power down mode the bit line voltage VBL, the cell plate voltage VPL and the cell substrate voltage VBB are floated and drift toward 0V. The bit line voltage VBL of a precharged cell is at a voltage less than VCCSA, where VCCSA is the power supply voltage of the sense amplifier, and bit line voltage VBL is floated when a deep power down signal DPD is applied. The memory cell plate voltage VPL and the cell substrate voltage VBB are also floated when a DPD signal is applied to the memory chip. When the DPD signal is removed, the voltage regulators and the charge pumps are reactivated and the voltages of the cells and the peripheral circuitry return to the voltage levels previous to applying the deep power down signal.

Internal circuit power not related to the power of the precharge memory cell can be maintained by coupling voltage from the chip external power supply VDD to memory support circuits instead of using the charge pumps and voltage regulators required in normal operation. Also Internal power, which is related to a precharged memory cell, is floated by turning off the pump circuits and voltage regulators associated with the precharged cell during deep power down mode. Considerable chip power can be saved when the system issues a deep power down mode command to the memory chip frequently because the switching charge to keep internal voltage levels is less than keeping the internal voltage levels because the memory chip is a large capacitor. In addition the use of a deep power down mode can reduce, or prevent, unexpected leakage in defective memory cells, such as word line shorts to bit lines and bit line shorts to the memory cell storage capacitor plate voltage line.

BRIEF DESCRIPTION OF THE DRAWINGS

This invention will be described with reference to the accompanying drawings, wherein.

DETAILED DESCRIPTION OF THE PREFERRED EMBODIMENT

Figure 1A:
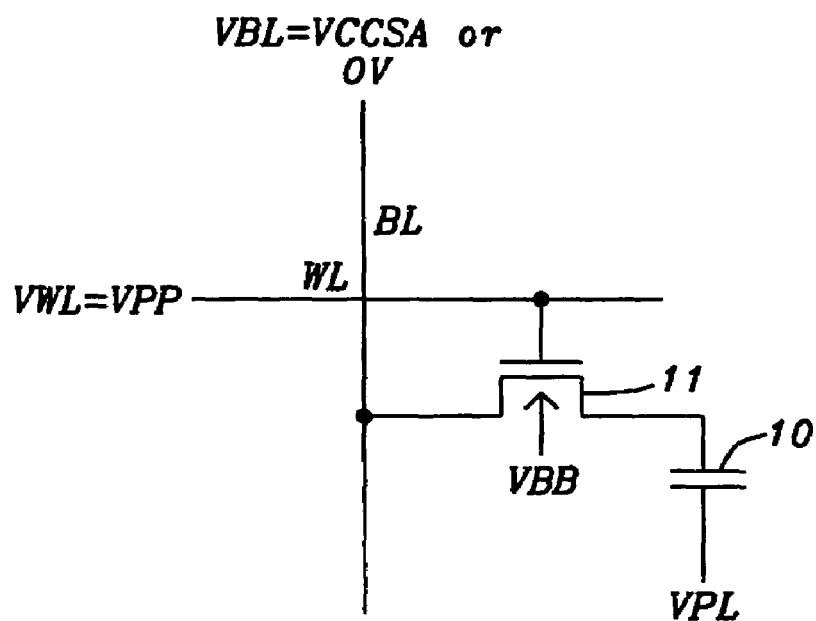
FIG. 1A shows cell voltages for the present invention in the active state.

Shown in FIG. 1A is a circuit diagram of the present invention for a DRAM memory cell with the voltages applied in an active state. The bit line voltage VBL is connected to a sense amplifier voltage that is equal to VCCSA or 0V depending on the bit line data. The word line voltage VWL of a selected cell in an active state is at VPP, and the plate voltage VPL coupled to the storage capacitor 10 is a voltage less than the bit line sense amplifier power voltage VCCSA and often half the value of the bit line sense amplifier voltage VCCSA. The substrate voltage VBB of the active cell 11 is less than 0V.

Figure 1B:
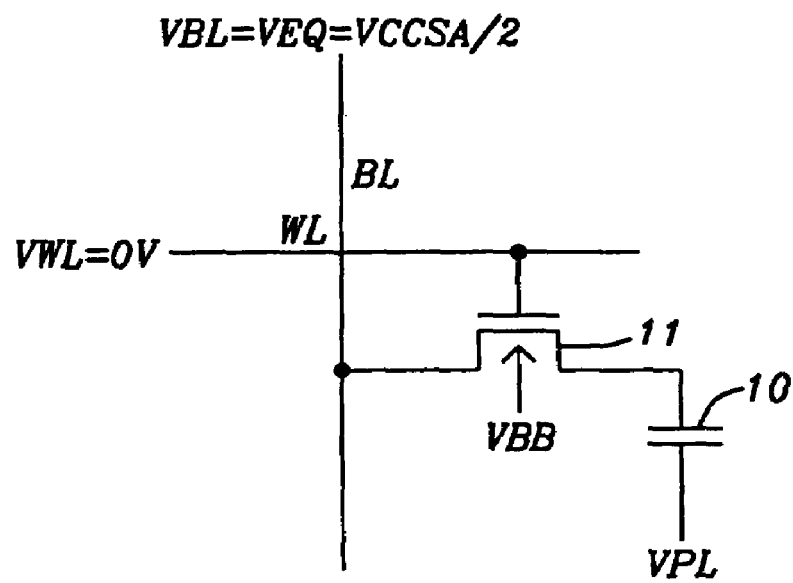
FIG. 1B shows cell voltages for the present invention in the precharge state.

Shown in FIG. 1b is a circuit diagram of the present invention for a DRAM memory cell with the voltages applied in a precharge state. The bit line voltage VBL is coupled to a voltage VEQ (the bit line sense amplifier equalized voltage), which is less than the bit line sense amplifier power voltage VCCSA and often half the value of the bit line sense amplifier power voltage VCCSA of the active cell. The word line voltage VWL of a cell 11 in precharge state is at 0V, and the plate voltage VPL coupled to the storage capacitor 10 is less than the bit line sense amplifier power voltage VCCSA of the active cell and often half the value of the bit line sense amplifier power voltage VCCSA of the active cell. The memory cell substrate voltage VBB is less than 0V in the precharge state.

Figure 2A:
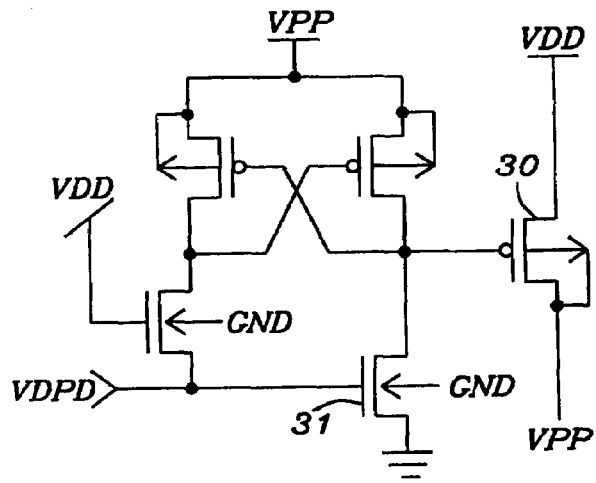
FIG. 2A through 2E shows schematic diagrams of the present invention pass gate circuits used in a deep power down mode.

FIG. 2A shows a pass gate circuit of the present invention for passing the external chip voltage VDD to VPP when a deep power down mode is turned on. The voltage VPP is a word line decoder circuit supply voltage, and is created by a charge pump under normal operations since it is required to have a higher value than the external chip voltage VDD. When the charge pump is turned off in a deep power down mode, the circuit shown in FIG. 2A connects VDD to VPP through the pass gate transistor 30. When the deep power down voltage VDPD is applied to the pull down transistor 31, the pass gate transistor 30 is turned on allowing VDD to "pass through" to VPP power lines. A level shifter inverter circuit is used so that a low amplitude VDD can be shifted to a high voltage VPP and allow the PMOS transistor to shut off, isolating VDD from VPP during normal operation in which VDPD=GND.

Figure 2B:
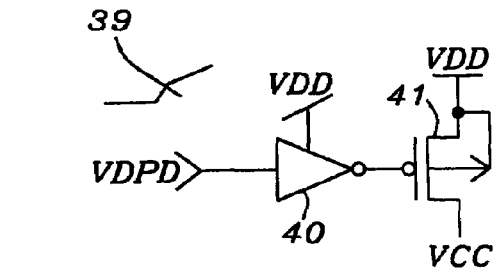

In FIG. 2B is shown an example of a pass gate circuit 39 of the present invention for coupling VDD to VCC during a deep power down mode after the voltage regulator supplying VCC is shut off and VDD is used to provide an adequate voltage to meet circuit needs. A VDPD signal voltage is applied to the input of an inverter 40, which turns on the pass through transistor 41 and allows VDD to be connected to the internal VCC power lines during a deep power down mode.

Figure 2C:
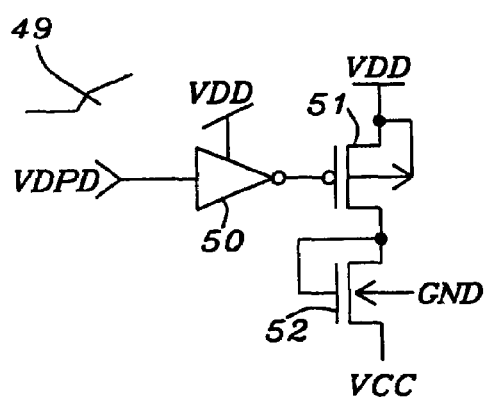
Figure 2D:
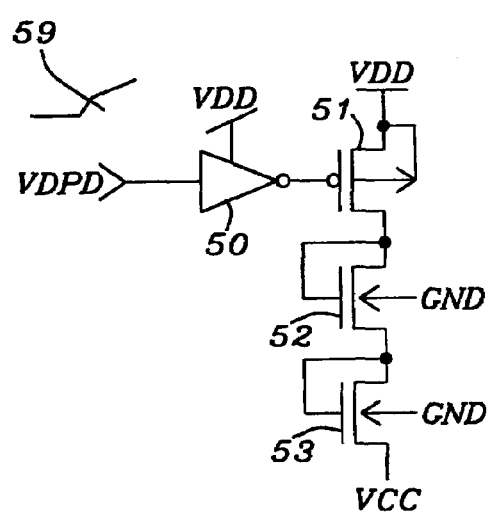

In FIGS. 2C and 2D are shown additional examples of a pass gate circuit of the present invention for passing VDD−Vt and VDD−2 Vt through to the internal peripheral circuit power voltage VCC. The circuit in FIG. 2C is a pass gate circuit 49 similar to that of FIG. 2B and uses a bias transistor device 52 to make VCC=VDD−Vt, where Vt is the threshold voltage of transistor device 52. In FIG. 2D is a pass gate circuit 59 that has an additional transistor device 53, which causes VCC=VDD−2 Vt. A number of additional transistor devices 53 can be used to create VCC=VDD−nVt where n is the number of transistor devices 52 and 53. The need for different pass gate circuits is caused by process parameters. Only one particular pass gate circuit for passing VDD through to VCC, 39, 49, or 59 are used on a memory chip at one time. The deep power down signal VDPD is applied to the input of the inverter 50, which turns on the pass gate transistor 51. Transistor 52 (53) reduces the VDD pass through voltage by a transistor threshold voltage Vt so that VDD−nVt is "passed through" to the internal peripheral circuit power voltage VCC.

Figure 2E:
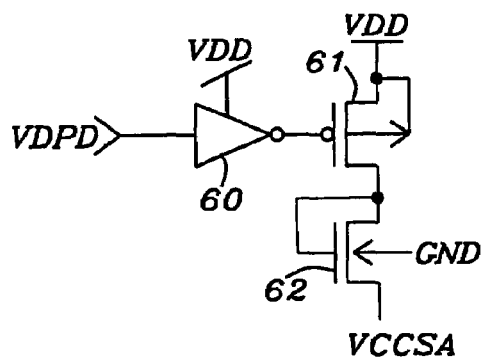

In FIG. 2E is shown an example of a pass gate circuit of the present invention for passing VCC−Vt through to the sense amplifier power voltage VCCSA. The deep power down signal VDPD is applied to the input of the inverter 60, which turns on the pass gate transistor 61. Transistor 62 reduces the VCC pass through voltage by a transistor threshold voltage so that VCC−Vt is "passed through" to the sense amplifier power voltage VCCSA. As with the VCC pass through circuits 39, 49 and 59, a transistor bias device 52, or a number of transistor bias devices 53 can be connected to transistor 62 to produce VCCSA=VCC−nVt. The number of transistor bias devices needed as determined by the variable n is dependent upon chip process parameters and the requirements of the sense amplifiers.

Figure 3A:
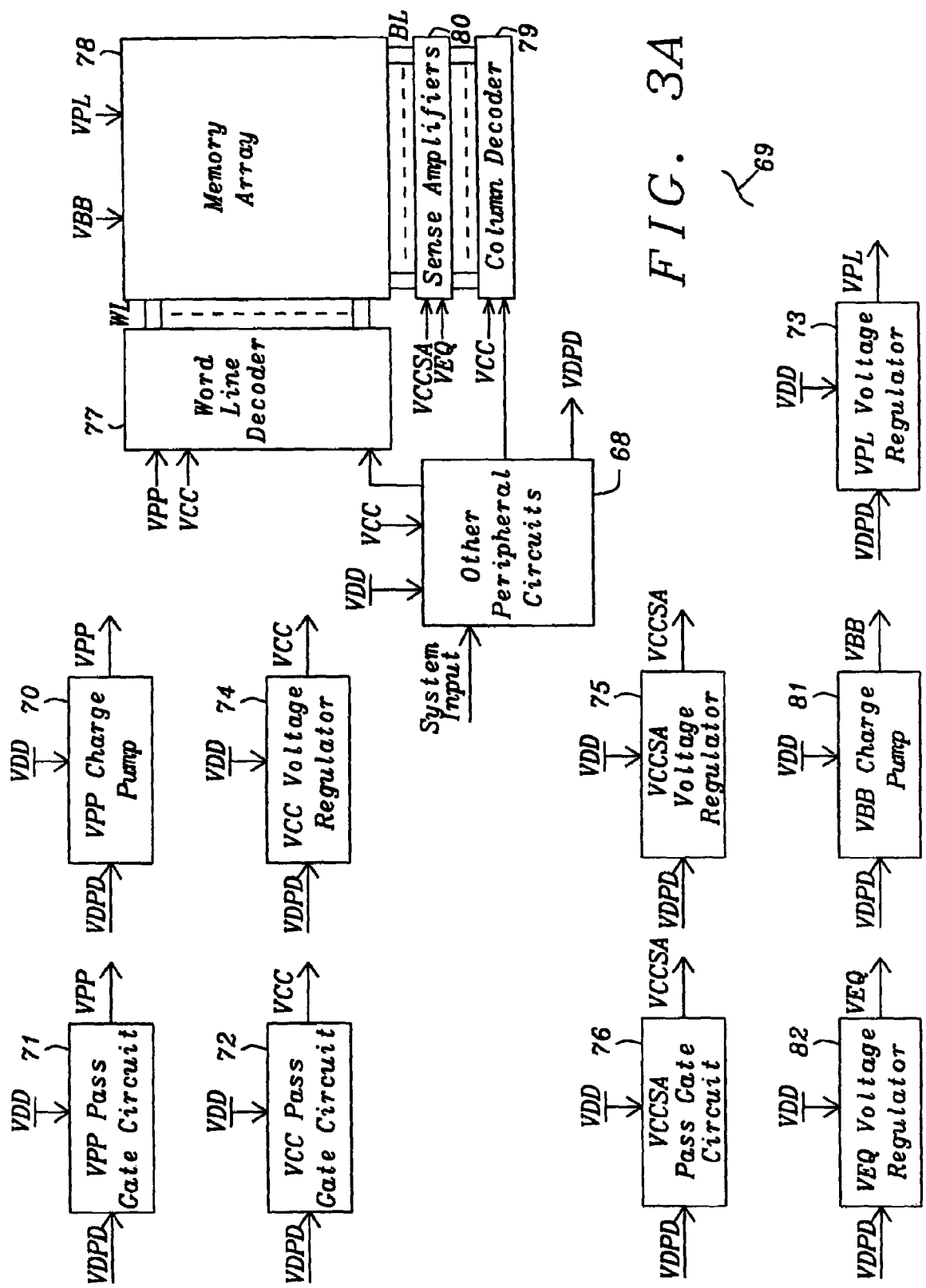
FIG. 3A shows a schematic diagram of the present invention of a low power memory chip with interconnections of pass gates, voltage regulators and charge pump circuits.

FIG. 3A is a block diagram of the first embodiment of the present invention showing a memory array 78 on a memory chip 69 with a word line decoder 77, a column decoder 79 and bit line sense amplifiers 80. Connected to the peripheral circuits of the array are various connections of voltage regulators 74 and 75, charge pumps 70 and pass gate circuits 71, 72 and 76, which are controlled to provide a voltage derived from VDD during a deep power down mode, where the charge pumps and the on-chip voltage regulators are controlled off by the deep power down control voltage VDPD. It should be noted that the block diagram in FIG. 3A is an example of circuits and connections and is not intended to demonstrate a complete DPD circuitry.

Before entering the DPD mode all memory cells in the array are place into a precharge mode by the other peripheral circuits 68. During the activation of the deep power down mode DPD when VDPD is raised from 0V to VDD, the charge pumps 70 and voltage regulators 74 and 75, internal to the memory chip 69, are turned off while at the same time, pass gate circuits 71, 72 and 76 are turned on to provide a voltage bias to the support circuits. The memory chip 69 external supply voltage VDD is used to provide bias to critical circuits during the deep power down mode, or voltage below VDD by a multiple of Vt (the threshold voltage of a transistor device) similar to that shown in FIG. 2E. Depending upon the number of transistors used in series in the pass gate such as shown in FIG. 2C, VCC=VDD−Vt or VCC=VDD−2 Vt shown in FIG. 2E. In general form of the equation for the pass through circuits is VCC=VDD−nVt where n=the number of transistor devices connected in series with the P-channel transistor 51 and 61.

Continuing to refer to FIG. 3A, the plate voltage regulator 73 and the bit line sense amplifier equalized voltage VEQ regulator 82 are turned off upon entry into the deep power down mode, which allows the plate voltage VPL and the bit line sense amplifier equalized voltage VEQ to float and drift towards 0V, and the VBB charge pump 81 is turned off upon entry into the DPD mode allowing the memory substrate voltage VBB to float and drift toward ground. When the deep power down mode is ended, VDPD is returned to 0V, the pass through circuits 71, 72 and 76 are turned off, the plate voltage generator 73, the bit line sense amplifier equalized voltage generator 82, the charge pump circuits 70 and voltage regulators 74 and 75 are all turned on along with the VBB charge pump 81, returning the low power memory chip to a normal operating state.

If a memory chip receives a deep power down mode command issued from the system external to the memory chip when the memory chip is in an active mode, the memory chip will first go into a precharge mode and then go to a deep power down mode. If a memory chip receives a deep power down mode command when the memory chip is in a precharge mode, the memory chip will go directly to the deep power down mode. If a memory chip receives an exit deep power down mode command when the memory is in the deep power down mode, the memory chip will go directly to the precharge mode.

Figure 3B:
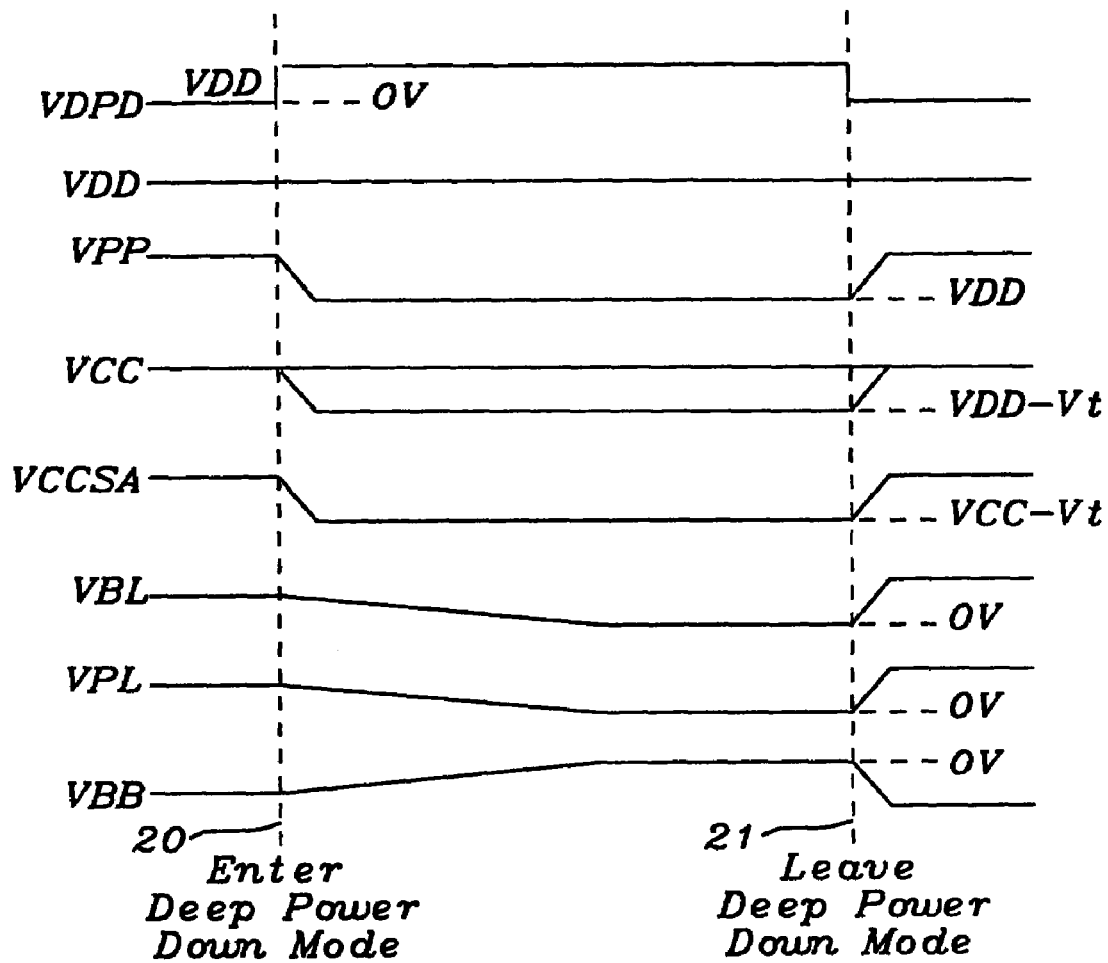
FIG. 3B shows external and internal voltage waveforms of the present invention for a low power memory in a deep power down mode using pass gate circuits.

FIG. 3B shows the waveforms of various voltages of the first embodiment upon entering the deep power down (DPD) mode 20 from the precharge state until the DPD mode is exited 21. A DPD signal VDPD is raised from 0V to VDD to enter the memory chip 69 into the DPD mode, which reduces power consumption of the memory chip. When the VDPD signal returns to 0V, the memory chip 69 exits the DPD mode. The external voltage VDD connected to the memory chip maintains its value before, during, and after the deep power down mode and is the power source for the pass gates. The internal word line voltage VPP for an active cell is lowered to VDD during the DPD mode. The word line voltage VPP normally supplied by a charge pump 70 is replaced by VDD during the DPD mode by pass gate 71.

Continuing to refer to FIG. 3B, the internal voltage VCC for peripheral circuits is either maintained at a value VCC=VDD or a value less than VDD, such as VCC=VDD−nVt, and which is created upon entry into the DPD mode. The sense amplifier internal power supply voltage VCCSA is reduced to a voltage below VCC during the DPD mode. The internal bit line voltage VBL of a precharged cell, which is coupled to VEQ, is less than VCCSA and is often one half of VCCSA. When the chip is entered into the DPD mode, VEQ is floated and drifts to 0V by the end of the DPD mode. The cell plate voltage VPL is less than VCCSA and is often one half of VCCSA. The plate voltage VPL is floated during the DPD mode and is allowed to drift to 0V by the end of the DPD mode, and the cell substrate voltage VBB, which is less than 0V, is floated and allowed to drift to 0V by the end of the DPD mode. Before entering the DPD mode, all memory cells must be in the precharge state. All of the regulators and charge pumps, which generate internal chip voltages, are turned off during the DPD mode to save standby power. Voltages such as VEQ, VPL and VBB that are related to the powering of the precharge cell are floated at the beginning of the DPD mode and allowed to drift to 0V, as shown in FIG. 3B. Voltages, such as VPP, VCC and VCCSA, which are not directly related to the precharge memory cell and are derived from voltage regulators or charge pumps, are replaced with voltages derived from the memory chip external voltage VDD. Pass gate circuits like those shown in FIG. 2A through FIG. 2E are used to connect the externally derived voltages to the support circuit internal power supply lines. The use of the pass gate circuits to maintain a voltage on the charge pump output lines, and voltage regulator output lines, which are connected to the support circuits, provide a bias that prevents circuit latch up when the memory chip is brought out of the deep power down mode. When the system issues an exit deep power down mode command to the other peripheral circuit, VDPD goes to ground (0V) and all pass through circuits 71, 72 and 76 are turned off, and charge pumps 70 and 81, voltage regulators 73, 74, 75 and 82 are turned on. The detection of the falling edge of VDPD returns the memory chip to normal operation.

The first embodiment of the present invention can save more system power when the system issues a deep power down mode command and an exit deep power down mode command to the memory chip 69 frequently because the switching charge of the memory chip for maintaining internal circuit voltage levels is smaller than not maintaining the internal circuit voltage levels. This is because the memory chip is in itself a large capacitor, and if the internal voltage levels are not maintained during deep power down mode, all of the charge of the memory will discharge to ground. When the memory chip goes back to normal operation by exiting deep power down mode, the external power voltage VDD would then be required to charge the large capacitor again. Also the deep power down mode of the present invention can prevent unexpected leakage in defective memory cells (or repaired cells) such as a word line short to a bit line or a bit line short to the plate voltage line.

Figure 4A:
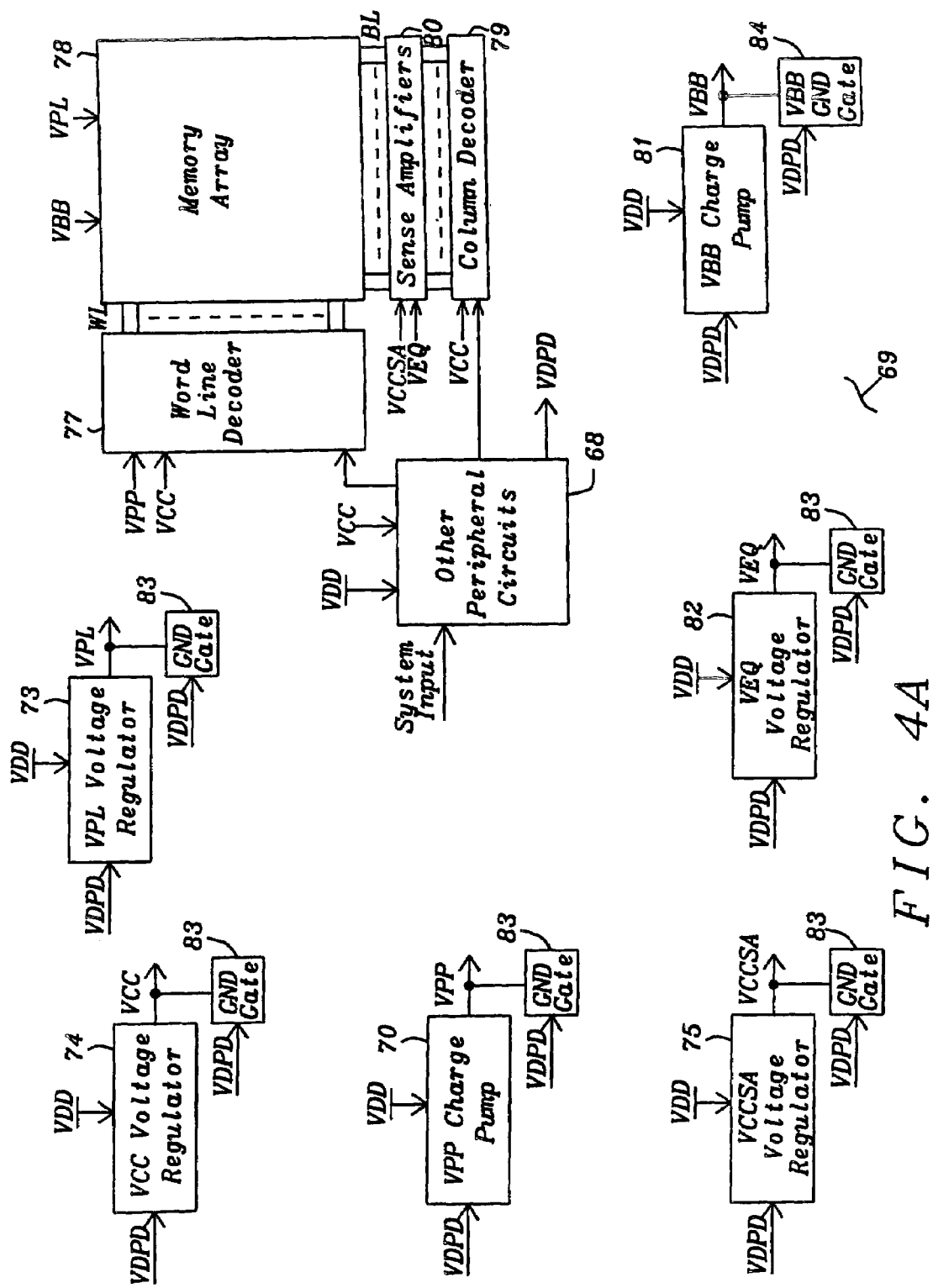
FIG. 4A shows a schematic diagram of the present invention of a low power memory chip using grounding gate circuits in place of pass gate circuits.

In the second embodiment of the present invention all of the regulators and pump circuits are turned off, and the associated output lines of the voltage regulators and charge pumps are discharged to ground by grounding gate 83 upon entering a deep power down mode. FIG. 4A shows a block diagram of the second embodiment. The grounding gates 81 are activated, which grounds voltages VPP, VCC, and VCCSA that are connected to the peripheral circuits, VEQ and VPL connected to the memory cell plates, and VBB connected to the memory substrate. The deep power down mode terminates when the memory chip receives an exit deep power down mode command where the grounding gates 83 and 84 are opened and the charge pumps 70 and 81, the voltage regulators 73, 74, 75 and 82 are returned to normal operation.

For the second embodiment, if a memory chip receives a deep power down mode command when the memory chip is in the active mode, the memory chip goes directly to the deep power down mode. If the memory chip receives a deep power down mode command when the memory chip is in the precharge mode, the memory will go directly to the deep power down mode. If the memory chip receives an exit deep power down mode command when in the deep power down mode, the memory chip will go directly to the precharge mode.

Figure 4B:
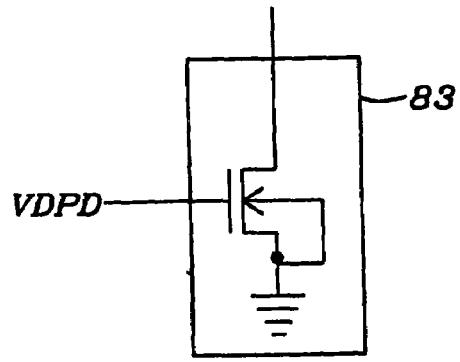
FIGS. 4B and 4C show schematic diagrams of the present invention of the grounding gate circuits shown in FIG. 4A.
Figure 4C:
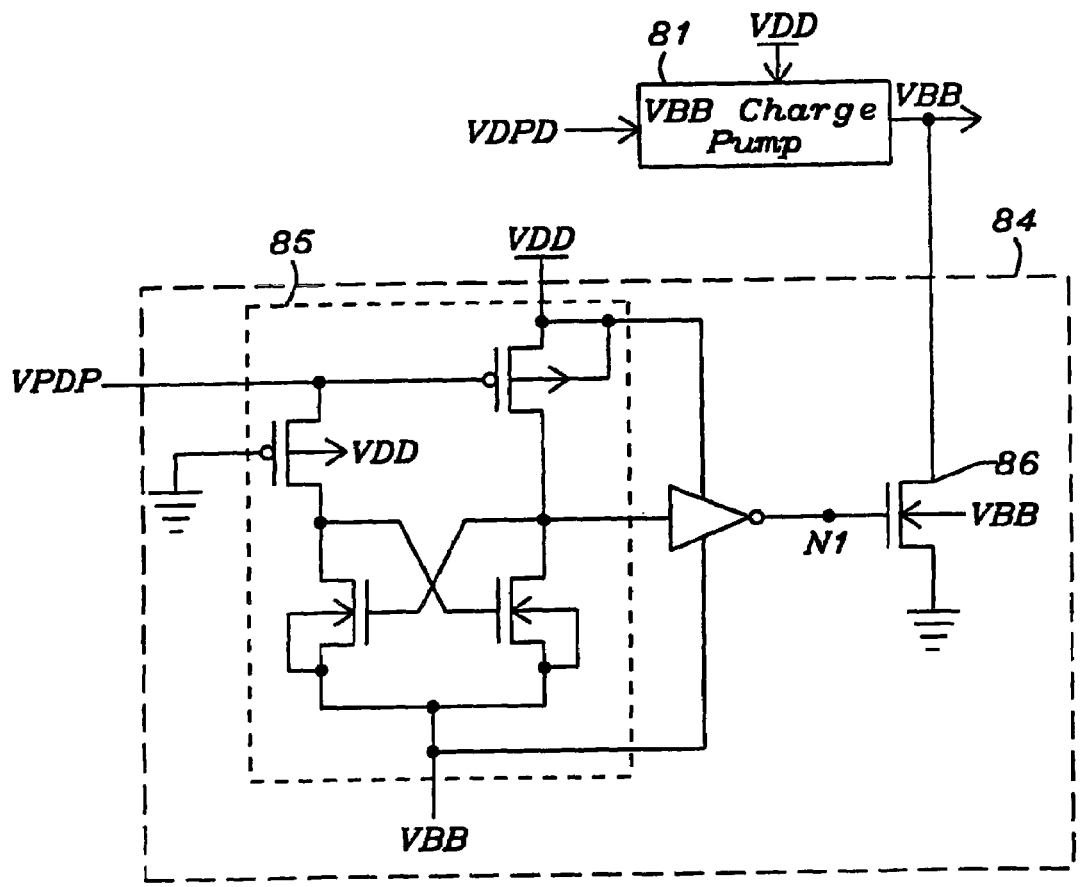

FIG. 4B shows a schematic diagram of the grounding gate 83 used in FIG. 4A. Raising the VDPD voltage from ground to VDD upon entering the deep power down mode grounds the output of the circuits to which the grounding gate is attached. FIG. 4C shows the grounding gate 84 used at the output of the VBB charge pump 81 shown in FIG. 4A. A VSS (ground) to VBB (a negative voltage) level shift inverter 85 allows the grounding gate to be fully turned off. If the VDPD voltage was connected directly to node N1, VBB would leak to ground when the memory chip 69 is in normal mode and VDPD=a low voltage such as ground. The grounding gate 86 cannot be fully turned off when node N1 is ground because VBB is a negative voltage. Thus by inserting the VSS to VBB level shifter 85, when VDPD is a low voltage, node N1 is at VBB and the grounding gate 86 can be fully turned off.

Figure 4D:
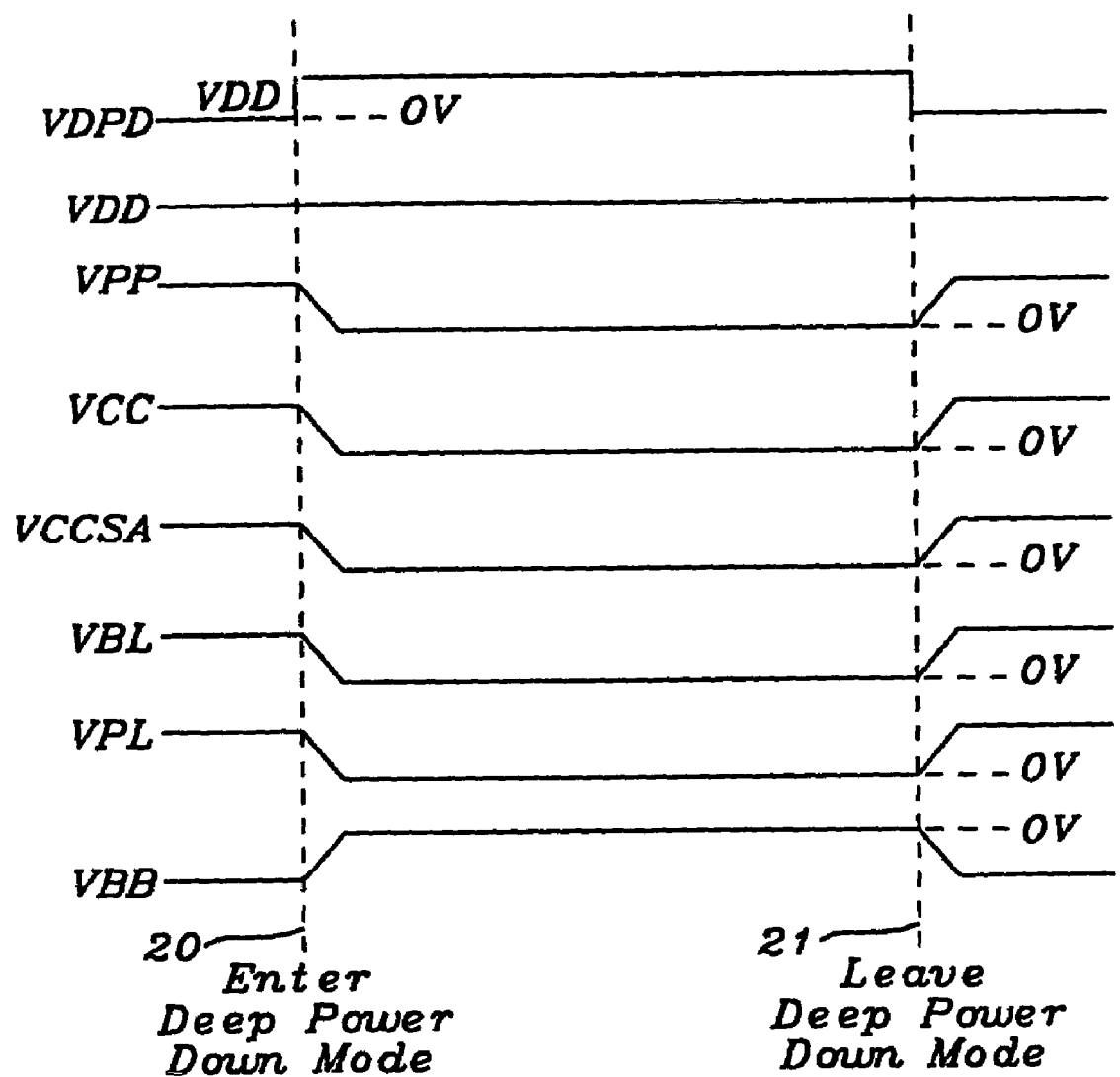
FIG. 4D shows external and internal voltage waveforms of the present invention for a low power memory in a deep power down mode using grounding gate circuits.

FIG. 4D shows the waveforms associated with the second embodiment of the present invention. FIG. 4B is similar to FIG. 3B except that VPP, VCC, VCCSA, VBB, VEQ and VPL are all brought down to 0V by the grounding gates 83 upon entry into deep power down mode 20 rather than allowing VEQ, VPL and VBB to drift toward ground and VPP, VCC and VCCSA to be derived from the external chip supply VDD as is the case for the first embodiment shown in FIG. 3B. When VDPD is raise from 0V to VDD the chip is entered into deep power down mode and the grounding gates 83 couple VPP, VCC, VCCSA, VEQ, VPL and VBB to ground. When the deep power down mode ends 21, VDPD is returned to 0V, the grounding gates 83 are opened and the charge pumps 70 and 81, the voltage regulators 73, 74, 75 and 82 are re-activated, and the memory chip returns to normal operation It should be noted that a select combination of pass gate circuits 71 72 76 shown in FIG. 3A and the grounding gates 83 shown in FIG. 4A can be used in a deep power down mode.

In a third embodiment of the present invention the charge pumps 70 and 81, voltage regulators 73, 74, 75 and 82 are turned off at the beginning of the deep power down mode 20. The grounding gates 83 either are not turned on or do not exist, and all internal power VPP, VCC, VCCSA, VEQ, VPL and VBB, or a subset are allowed to float. At the end of the deep power down mode 21 all internal power is returned to normal operations.

For the third embodiment, if a memory chip receives a deep power down mode command when the memory chip is in the active mode, the memory chip goes directly to the deep power down mode. If the memory chip receives a deep power down mode command when the memory chip is in the precharge mode, the memory will go directly to the deep power down mode. If the memory chip receives an exit deep power down mode command when in the deep power down mode, the memory chip will go directly to the precharge mode.

While the invention has been particularly shown and described with reference to preferred embodiments thereof, it will be understood by those skilled in the art that various changes in form and details may be made without departing from the spirit and scope of the invention.

What is claimed is:

1. A deep power down circuit to save power in a low power memory chip, comprising:
   a plurality of internal voltage generators, said internal voltage generators comprising:
   a first group internal voltage generators which generate voltages related to the voltages of cells of the memory chip, any one of the first group internal voltage generators being in a first predetermined state in a deep power down mode, the first predetermined state being a grounding-level state or a floating-level state; and
   a second group internal voltage generators which generate voltages not related to the voltages of the cells of the memory chip, any one of the second group internal voltage generators being in a second predetermined state in the deep power down mode, the second predetermined state being selected from the group consisting of a keep-level state, a grounding-level state, and a floating-level state.

2. The deep power down circuit of claim 1, wherein any one of the first group internal voltage generators is in the first predetermined state after the cells of the memory chip are pre-charged, and any one of the second group internal voltage generators is in the second predetermined state after the cells of the memory chip are pre-charged.

3. The deep power down circuit of claim 1, wherein the first group internal voltage generators comprises a plurality of voltage regulators and charge pump circuits internal to the low power memory chip.

4. The deep power down circuit of claim 1, further comprising a grounding gate circuit coupled to the output of one of the first group internal voltage generators which is in the grounding-level state, wherein the grounding gate circuit is active to ground the output of the one of the first group internal voltage generators after the one of the first group internal voltage generators is turned off in the deep power down mode.

5. The deep power down circuit of claim 1, wherein one of the first group internal voltage generators is in the floating-level state after the one of the first group internal voltage generators is turned off in the deep power down mode.

6. The deep power down circuit of claim 1, wherein the second group internal voltage generators comprises a plurality of voltage regulators and charge pump circuits internal to the low power memory chip.

7. The deep power down circuit of claim 1, further comprising a passing gate circuit coupled to the output of one of the second group internal voltage generators which is in the keep-level state, wherein the passing gate circuit is active and couples an external voltage of the low power memory chip to the output of the one of the second group internal voltage generators memory after the one of the second group internal voltage generators is turned off in the deep power down mode.

8. The deep power down circuit of claim 1, further comprising a grounding gate circuit coupled to the output of one of the second group internal voltage generators which is in the grounding-level state, wherein the grounding gate circuit is active to ground the output of the one of the second group internal voltage generators after the one of the second group internal voltage generators is turned off in the deep power down mode.

9. The deep power down circuit of claim 1, wherein one of the second group internal voltage generators is in the floating-level state after the one of the second group internal voltage generators is turned off in the deep power down mode.

10. A deep power down circuit comprising:
   an IC chip; and
   a plurality of internal voltage generators providing the chip with internal circuit power, any one of the plurality of internal voltage generators being in a predetermined state in a deep power down mode, the predetermined state selected from the group consisting of a keep-level state, a grounding-level state, and a floating-level state;

wherein one of the plurality of internal voltage generators is in the floating-level state after the one of the plurality of internal voltage generators is turned off in the deep power down mode.

11. A deep power down circuit comprising:

an IC chip;

a plurality of internal voltage generators providing the chip with internal circuit power, any one of the plurality of internal voltage generators being in a predetermined state in a deep power down mode, the predetermined state selected from the group consisting of a keep-level state, a grounding-level state, and a floating-level state; and, a passing gate circuit coupled to the output of one of the plurality of internal voltage generators which is in the keep-level state, wherein the passing gate circuit is active and couples an external voltage of the IC chip to the output of the one of the plurality of internal voltage generators after the one of the plurality of internal voltage generators is turned off in the deep power down mode.

12. A deep power down circuit comprising:

an IC chip; and a plurality of internal voltage generators providing the chip with internal circuit power, a first group of the internal voltage generators being in a keep-level state during a deep power down mode, a second group of the internal voltage generators being in a grounding-level state during the deep power down mode;

wherein the keep-level state is different from the grounding-level state.

13. The deep power down circuit of claim 12, further comprising a third group of the plurality of internal voltage generators being in a floating-level state during the deep power down mode.

* * * * *